US008245663B2

(12) United States Patent
Fazio

(10) Patent No.: US 8,245,663 B2
(45) Date of Patent: Aug. 21, 2012

(54) APPARATUS AND METHODS FOR HANDLING WORKPIECES IN A PROCESSING SYSTEM

(75) Inventor: James P. Fazio, San Mateo, CA (US)

(73) Assignee: Nordson Corporation, Westlake, OH (US)

( * ) Notice: Subject to any disclaimer, the term of this patent is extended or adjusted under 35 U.S.C. 154(b) by 569 days.

(21) Appl. No.: 12/376,175

(22) PCT Filed: Aug. 17, 2007

(86) PCT No.: PCT/US2007/076205
§ 371 (c)(1),
(2), (4) Date: Feb. 3, 2009

(87) PCT Pub. No.: WO2008/024681
PCT Pub. Date: Feb. 28, 2008

(65) Prior Publication Data
US 2009/0311088 A1 Dec. 17, 2009

Related U.S. Application Data

(60) Provisional application No. 60/823,175, filed on Aug. 22, 2006.

(51) Int. Cl.
*B23K 10/00* (2006.01)
*C23F 1/00* (2006.01)
(52) U.S. Cl. ............ 118/723 E; 118/723 R; 156/345.47
(58) Field of Classification Search .............. 118/723 R, 118/723 E; 156/345.47
See application file for complete search history.

(56) References Cited

U.S. PATENT DOCUMENTS

| 5,569,350 | A | 10/1996 | Osada et al. |
| 5,823,416 | A | 10/1998 | Haji |
| 5,972,163 | A | 10/1999 | Haji |
| 6,093,904 | A | 7/2000 | Haji |

(Continued)

FOREIGN PATENT DOCUMENTS

JP 07033973 A 2/1995

OTHER PUBLICATIONS

International Searching Authority, International Search Report issued in corresponding PCT Application serial No. PCT/US2007/076205 dated Feb. 19, 2008.

(Continued)

*Primary Examiner* — Sylvia R. MacArthur
(74) *Attorney, Agent, or Firm* — Wood, Herron & Evans, LLP

(57) ABSTRACT

Apparatus and methods for handling workpieces in a processing system. The workpiece vertical lift mechanism (200), which is disposed inside a process chamber (40) of the processing system, is adapted to transfer a workpiece (55) to and from a pedestal portion (286) of an electrode (24). The pedestal portion (286) is configured to support the workpiece (55) during processing. The workpiece vertical lift mechanism (200) including a workpiece fixture (290) movable relative to the pedestal portion (286) between a first position in which the workpiece fixture (290) holds the workpiece (55) in a non-contacting relationship with the pedestal portion (286) and a second position in which the pedestal portion (286) projects above workpiece fixture (290) so as to transfer the workpiece (55) from the workpiece fixture (290) to the pedestal portion (286).

15 Claims, 14 Drawing Sheets

U.S. PATENT DOCUMENTS

| | | |
|---|---|---|
| 6,440,178 B2 | 8/2002 | Berner et al. |
| 2002/0021435 A1 | 2/2002 | Yamada |
| 2003/0020928 A1 | 1/2003 | Ritzdorf et al. |
| 2003/0183339 A1 | 10/2003 | Sasaoka et al. |
| 2003/0232512 A1 | 12/2003 | Dickinson et al. |
| 2006/0011299 A1 | 1/2006 | Condrashoff et al. |
| 2006/0090703 A1 | 5/2006 | Kaise et al. |
| 2009/0311088 A1* | 12/2009 | Fazio .......................... 414/754 |

OTHER PUBLICATIONS

Japanese Patent Office, Office Action issued in related Japanese Patent Application No. 2009-525702 dated Jan. 23, 2012.

* cited by examiner

APPARATUS AND METHODS FOR HANDLING WORKPIECES IN A PROCESSING SYSTEM

CROSS-REFERENCE TO RELATED APPLICATIONS

This application claims the benefit of U.S. Provisional Application No. 60/823,175, filed Aug. 22, 2006, the disclosure of which is hereby incorporated by reference herein in its entirety.

FIELD OF THE INVENTION

The invention generally relates to processing systems and, more particularly, to apparatus and methods for handling workpieces in a processing system.

BACKGROUND OF THE INVENTION

Processing systems, such as plasma processing tools, rely on holding mechanisms to support a workpiece, such as a semiconductor, ceramic, or metal substrate or wafer, inside a process chamber during the performance of a treatment process. Certain holding mechanisms include a plurality of lift pins that are configured to raise or lower in unison for lifting and lowering the workpiece relative to a top surface of a support. In the lowered position, the tips of the lift pins are either flush with, or slightly recessed below, the top surface of the support so that the workpiece at least partially contacts the top surface. In the raised position, the tips of the lift pins contact a bottom surface (backside) of the workpiece and elevate the workpiece above the top surface of the support. Typically, multiple lift pins establish multiple points of contact with the backside of the workpiece. The resulting gap between the lifted workpiece and the surface of the support permits an access space for insertion of an end effector.

The requirement for lift pins in conventional processing systems necessitates one or more mechanical feedthroughs in the process chamber for transferring mechanical motion from a location outside of the process chamber to the lift pins. Each mechanical feedthrough requires at least one port extending through the chamber wall of the process chamber. Each port provides a prime location for vacuum leaks. Moreover, contact between the lift pins and the workpiece may damage or contaminate the backside of the workpiece. Further, the process of raising and lowering the lift pins may generate particles that contaminate the process chamber and, if not remediated, eventually, result in contamination of the processed workpieces.

It would therefore be desirable to provide a workpiece vertical lift mechanism that addresses these and other deficiencies or challenges of conventional processing systems.

SUMMARY

In an embodiment of the invention, an apparatus comprises a process chamber including upper and lower electrodes. A pedestal portion of the lower electrode is configured to support the workpiece during processing. A workpiece vertical lift mechanism is disposed in the process chamber. The workpiece vertical lift mechanism includes a vertically movable member disposed between the upper and lower electrodes. The vertically movable member is configured to move vertically relative to the pedestal portion of the lower electrode between first and second positions. In the first position, the vertically movable member holds the workpiece in a non-contacting relationship with the pedestal portion. In the second position, the pedestal portion of the lower electrode projects above the first member so as to transfer the workpiece from the first member to the pedestal portion.

In another embodiment, a processing method includes transferring a workpiece to a vertically movable member inside a process chamber and then moving the movable member vertically toward a pedestal portion of a lower electrode so as to transfer the workpiece from the movable member to the pedestal portion of the lower electrode. The method further comprises generating a plasma inside the process chamber using the lower electrode and an upper electrode, and processing the workpiece with the plasma while the workpiece is supported on the pedestal portion, of the lower electrode.

BRIEF DESCRIPTION OF THE FIGURES

The accompanying drawings, which, are incorporated in and constitute a part of this specification, illustrate embodiments of the invention and, together with a general description of the invention given above, and the detailed description given below, serve to explain the principles of the embodiments of the invention.

DETAILED DESCRIPTION

Figure 1:
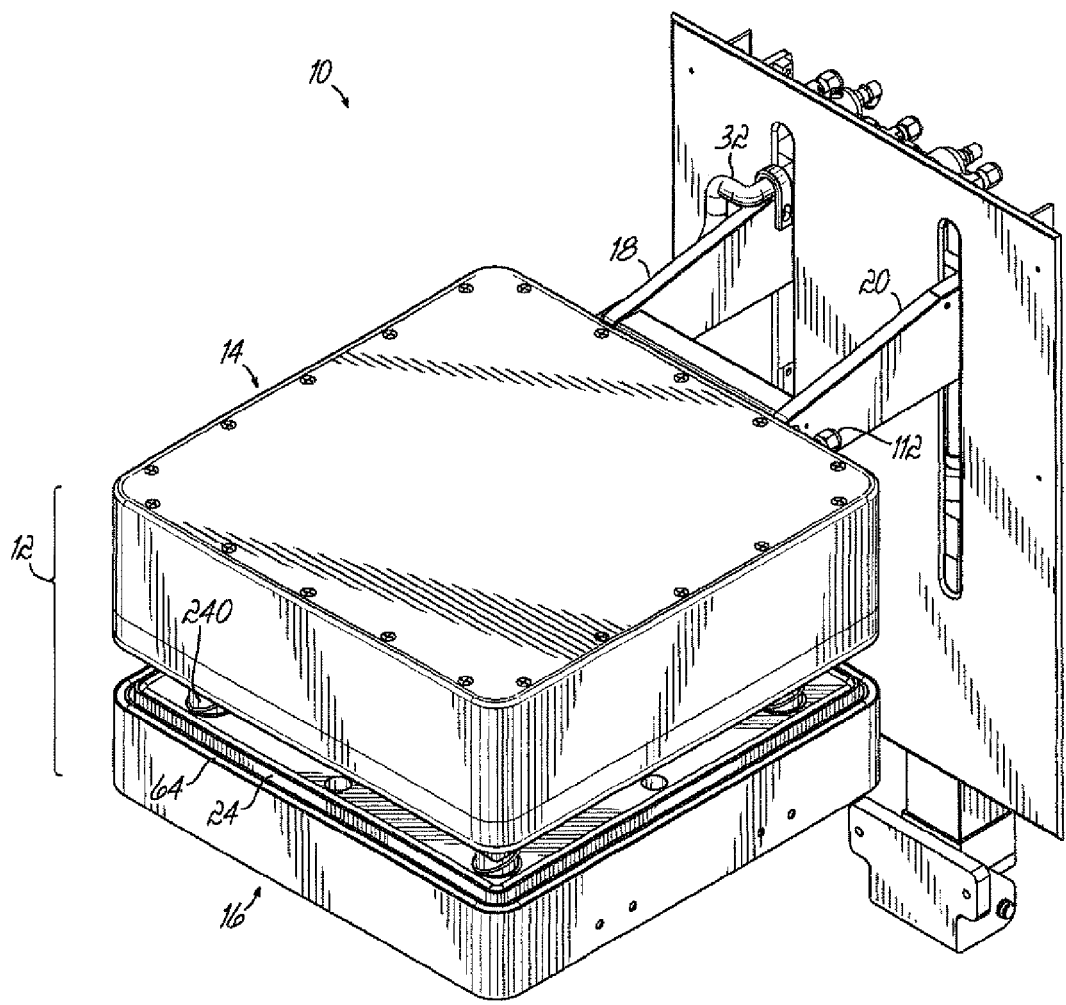
FIG. 1 is a perspective view of a plasma processing system including a workpiece vertical lift mechanism in accordance with, an embodiment of the invention.
Figure 2:
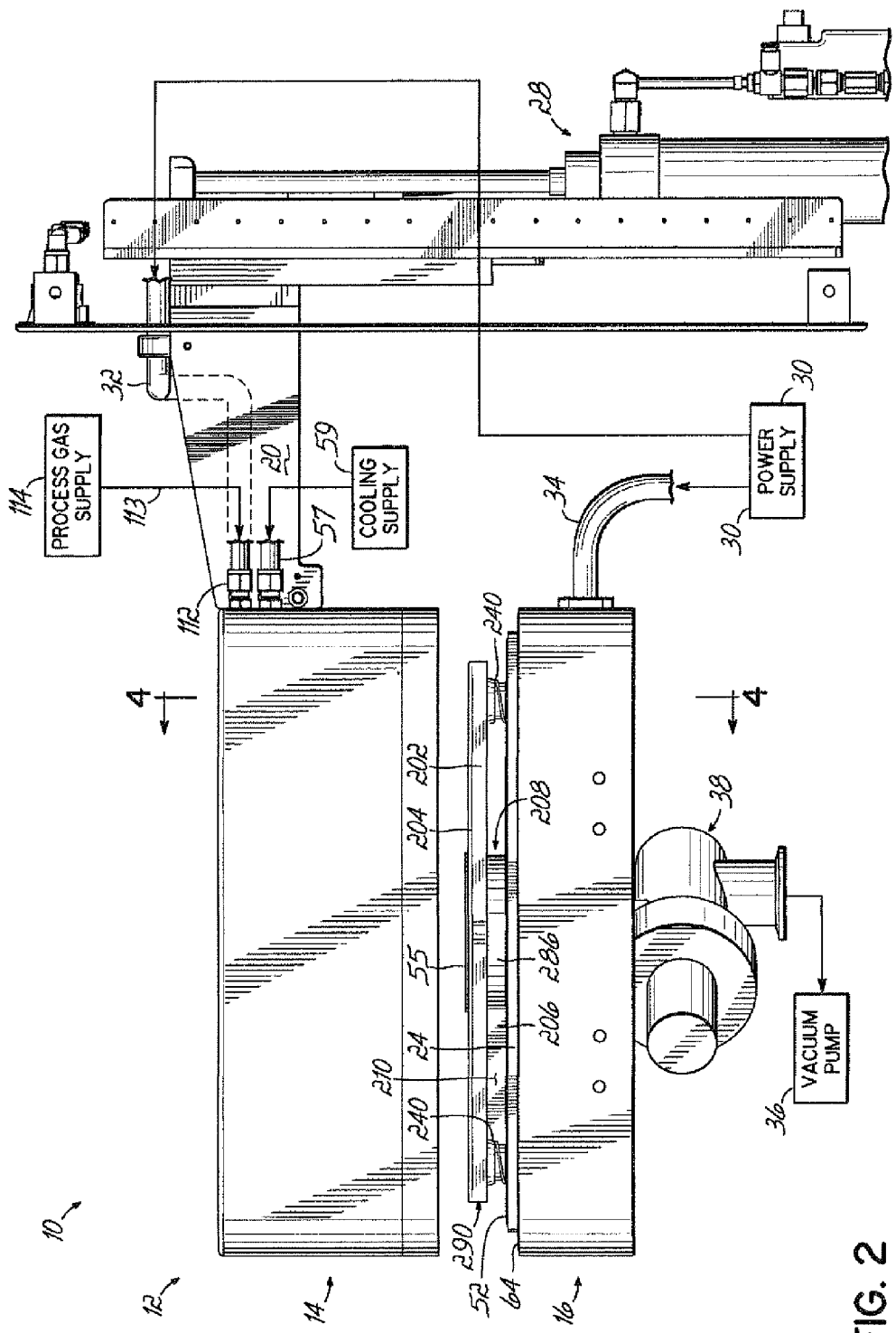
FIG. 2 is a front view of the plasma processing system of FIG. 1.
Figure 3:
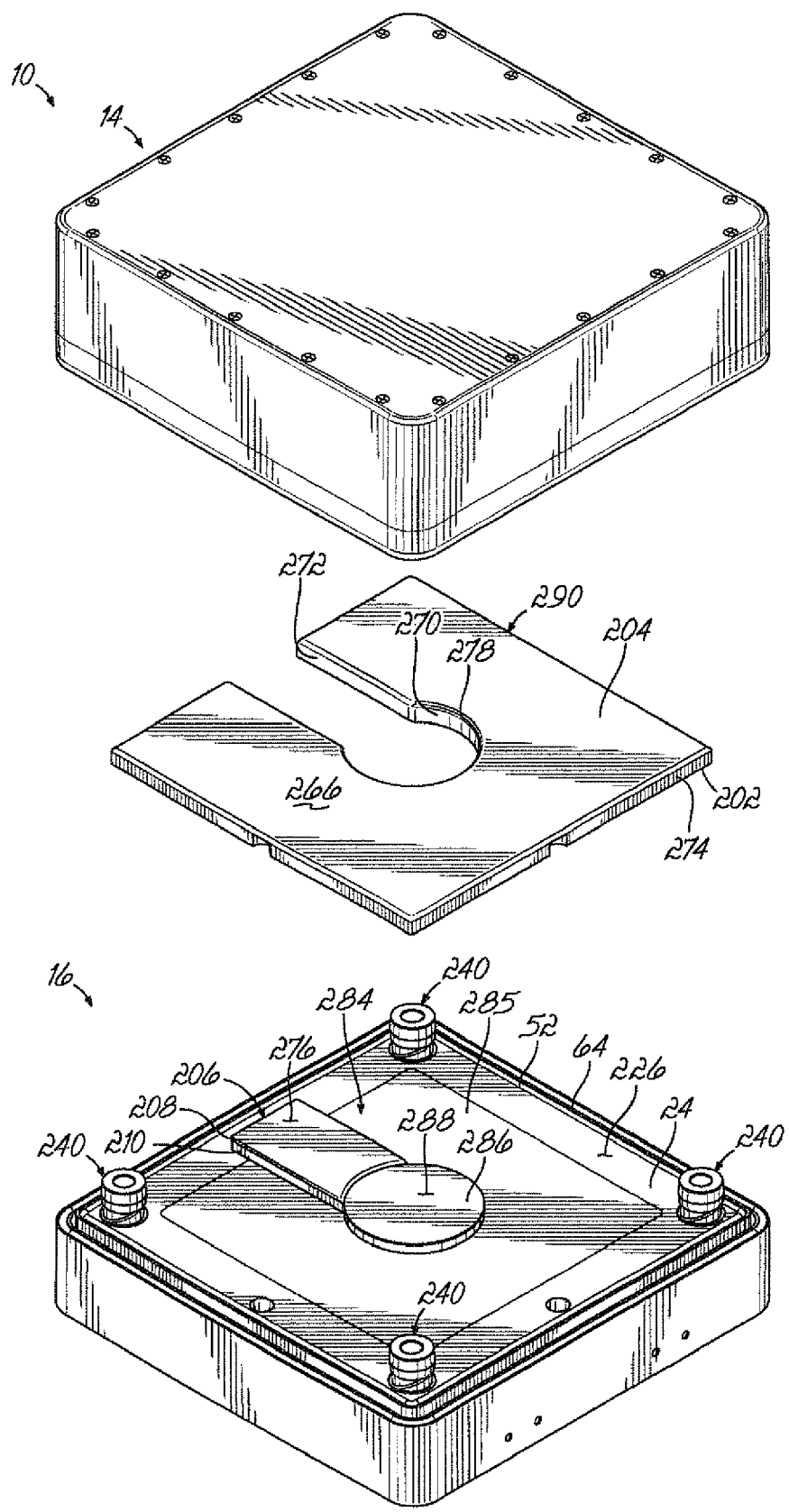
FIG. 3 is an exploded view of the enclosure and workpiece vertical lift mechanism of the plasma processing system of FIGS. 1 and 2.
Figure 3A:
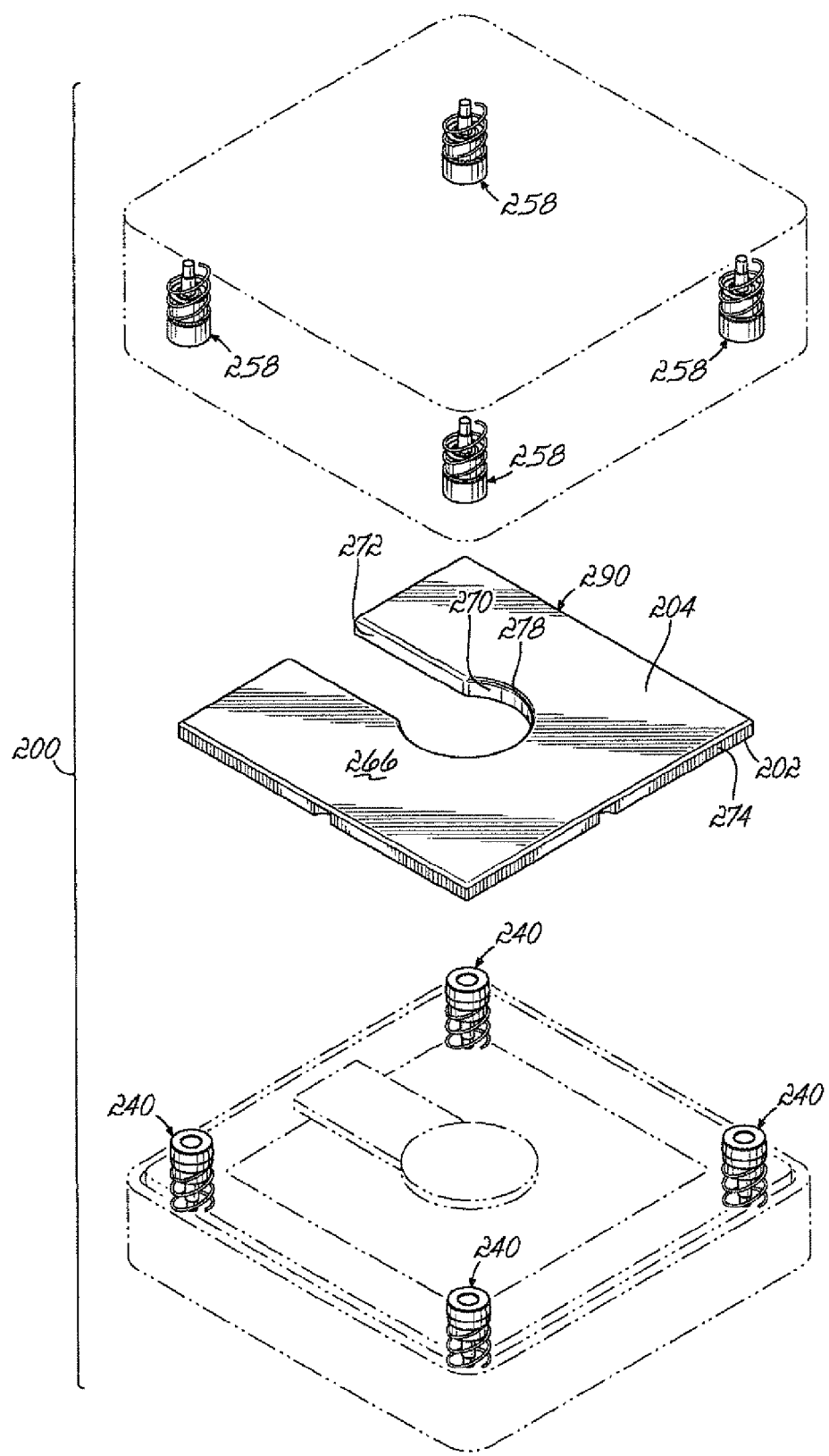
FIG. 3A is another exploded view of the workpiece vertical lift mechanism of the plasma processing system of FIGS. 1, 2, and 3.

With reference to FIGS. 1-4, a plasma processing system 10 generally includes an enclosure 12 having a lid 14 and a base 16 upon which the lid 14 rests, support arms 18, 20 depending from the lid 14, an upper electrode 22, a lower electrode 24, and a workpiece vertical lift mechanism 200 (FIG. 3A). The plasma processing system 10 further includes a tubular separating member or ring 26 positioned between the upper and lower electrodes 22, 24 and contacting confronting faces about the perimeter of the upper and lower electrodes 22, 24. The confronting faces of the upper and lower electrodes 22, 24 are generally planar and parallel plates and have approximately identical surface areas.

Figure 4:
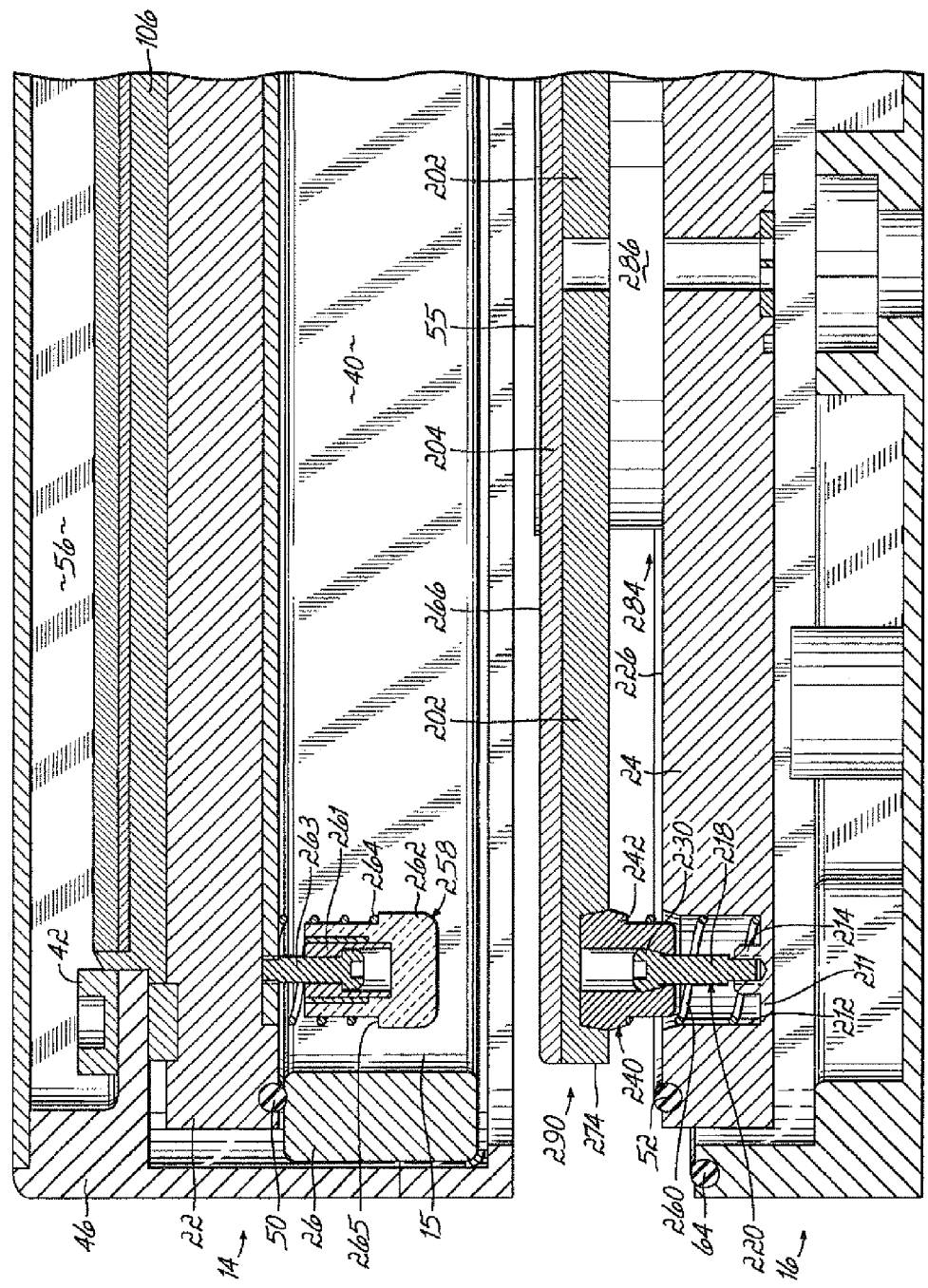
FIG. 4 is a cross-sectional view taken generally along line 4-4 in FIG. 2.
Figure 5:
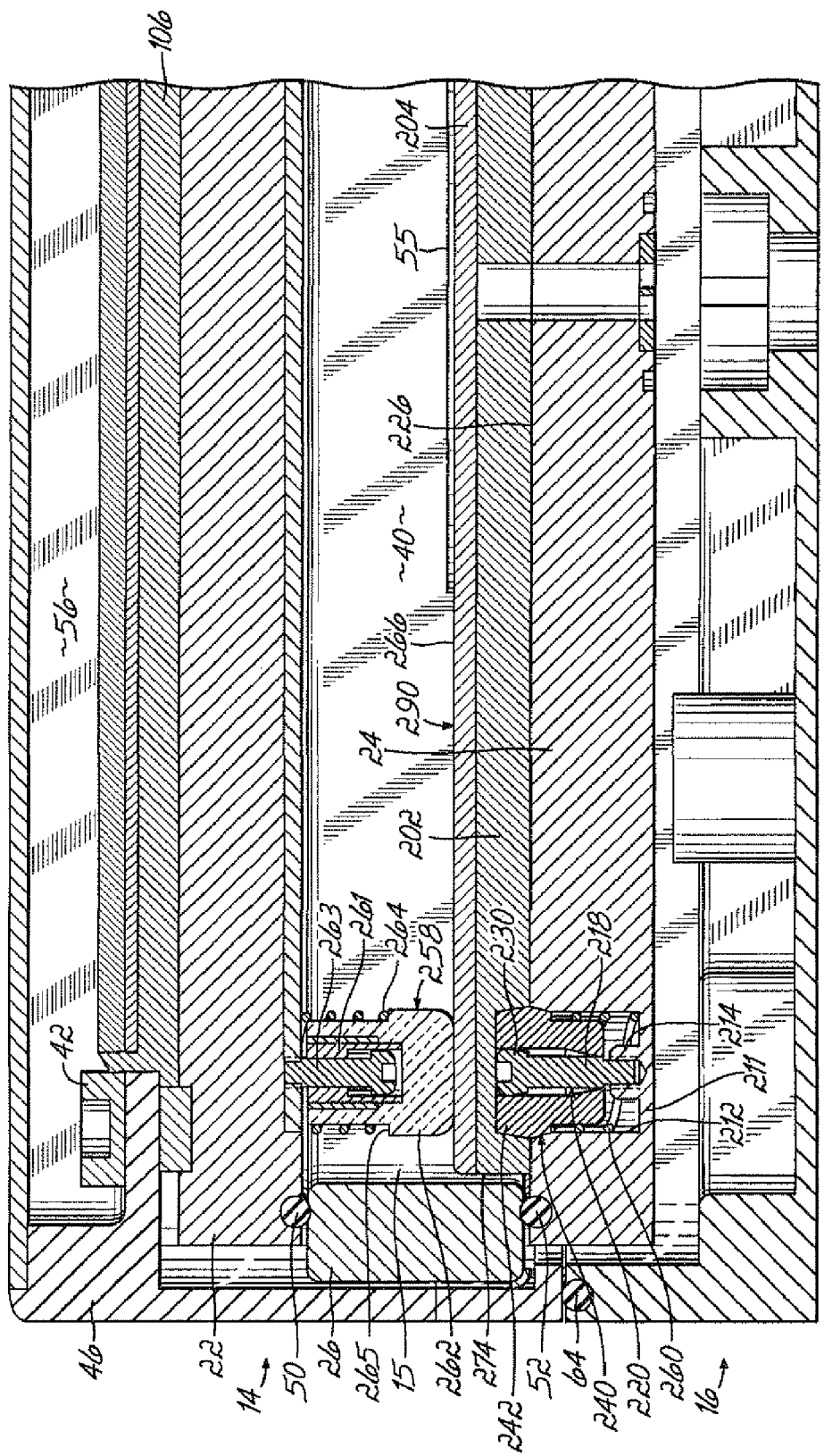
FIG. 5 is a cross-sectional view similar to FIG. 4 in which the lid of the enclosure is in contact with the base of the enclosure.
Figure 11:
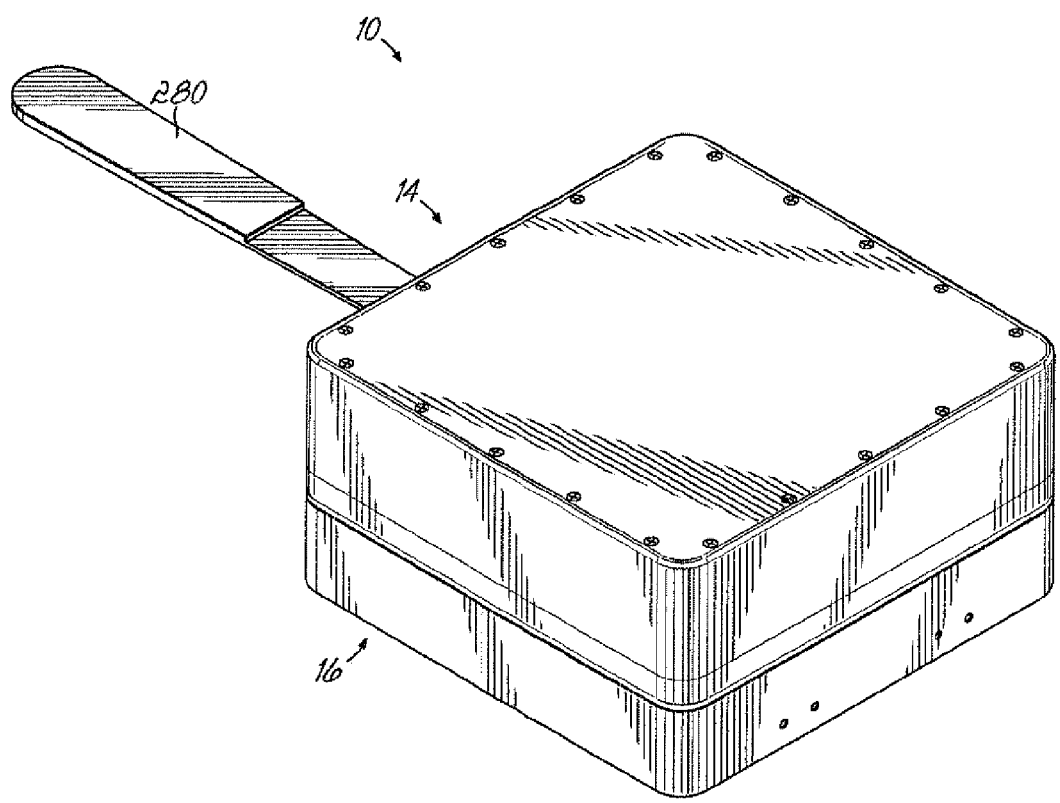

The support arms 18, 20 mechanically couple a housing 46 of the lid 14 with a lifting device 28, illustrated in the representative embodiment as a pneumatic cylinder, which is configured to raise and lower the lid 14 relative to the base 16 between a raised position (FIGS. 1, 2, 4) and a lowered position (FIGS. 5, 11). Alternatively, the lifting device 28 may comprise a linear slide. When the lid 14 is in its lowered position, a conducting member 64 is captured between the respective perimeters of the lid 14 and base 16, which are metallic. The conducting member 64 supplies a good electrical contact between the lid 14 and base 16 to establish a conductive outer shell surrounding the upper and lower electrodes 22, 24.

The upper electrode 22 is suspended from the housing 46 of the lid 14 by a plurality of electrically insulating spacers, of which spacer 42 is visible in FIG. 4. As a result, the upper electrode 22 moves along with the housing 46 when the lid 14 is moved by the lifting device between the raised and lowered positions relative to the base 16. When the lid 14 is lowered into contact with the base 16 as shown in FIG. 5, a sealing member 52 is compressed between the separating ring 26 and a perimeter of the lower electrode 24 to define a process chamber 40 (FIG. 5). The process chamber 40 includes the volume or space bounded by the inwardly-facing horizontal surfaces of the upper and lower electrodes 22, 24 and the inwardly-facing vertical surface of the sidewall defined by the separating ring 26.

In the raised position, unprocessed workpieces 55 can be transferred to the workpiece vertical lift mechanism 200 and processed workpieces 55 can be removed from the workpiece vertical lift mechanism 200. The workpiece vertical lift mechanism 200 is operative to facilitate the loading of workpieces 55 onto a pedestal portion 286 of the lower electrode 24 and the unloading of workpieces 55 from the pedestal portion 286 of the lower electrode 24. In the lowered position of the lid 14 and upper electrode 22, the process chamber 40 defines an environment that is suitable for plasma processing one of the workpieces 55.

For in-line applications, the plasma processing system 10 may be provided with an input carrier (not shown) that provides unprocessed workpieces 55, an output carrier (not shown) that receives processed workpieces 55, and an end effector 280 (FIG. 7) on an articulated arm of a robot (not shown). The robot includes a series of actuators (not shown) that permit controlled, multi-axis articulated motion of the articulated arm and end effector 280. The end effector 280 is manipulated by the robot for transferring workpieces 55 from the input carrier to the process chamber 40 and from the process chamber 40 to the output carrier. In addition, a plurality of workpieces 55 may be introduced in such a way that each individual workpiece 55 is independently introduced into the plasma processing system 10 or in such a way that multiple workpieces 55 are currently introduced into the plasma processing system 10. Individual workpieces 55 may also be positioned on a support or carrier and transported thereon into the plasma processing system 10. The plasma processing system 10 may comprise a single process station among multiple process stations that cooperate to sequentially process multiple workpieces 55 moving in an assembly line fashion among the multiple process stations.

A power supply 30, which is coupled with the upper and lower electrodes 22, 24 by shielded coaxial cables or transmission lines 32, 34, respectively, controls the power level and frequency of operation of the upper and lower electrodes 22, 24. The power supply 30 may be an alternating current power supply operating at an extremely low frequency, such as 50 Hz and 60 Hz, at a high radio frequency, such as 40 kHz and 13.56 MHz, at a medium radio frequency, such as 1 kHz, or at a microwave frequency, such as 2.4 GHz. Tire power supply 30 may also operate at dual frequencies superimposed upon one another. Alternatively, the power supply 30 may be a direct current (DC) power supply in which the plasma is non-oscillating. In other alternative embodiments, power supply 30 may supply a radio frequency (RF) power component that provides a dense plasma and a DC power component that independently increases ion energy without affecting the plasma density.

In certain embodiments of the invention, the power supply 30 may operate at one or more radio frequencies and include an impedance matching network (not shown) that measures reflected power from the load represented by the upper and lower electrodes 22, 24 and plasma confined therebetween back to the power supply 30. The impedance matching network adjusts the frequency of operation of power supply 30 to minimize the reflected power. The construction of such matching networks is understood by a person of ordinary skill in the art. For example, the impedance matching network may tune the matching network by changing the capacitance of variable capacitors within the matching network to match the impedance of the power supply 30 to the impedance of the load as the load changes. The power and voltage levels and operating frequency(ies) may vary depending upon the particular application.

A vacuum pump 36 continuously pumps byproduct generated by the plasma process and non-reacted process gas from the process chamber 40, when the plasma processing system 10 is operating, through a vacuum manifold 38. A sealing member 50 (FIGS. 4 and 5) is compressed between the separating ring 26 and the upper electrode 22. The vacuum pump 36 is operative to maintain the total pressure in the process chamber 40 at a sub-atmospheric level sufficiently low to promote plasma generation when power is applied by the operation of the upper and lower electrodes 22, 24. Typical pressures suitable for plasma generation range from about twenty (20) millitorr to greater than about fifty (50) torr. The pressure within the process chamber 40 is controlled in accordance with a particular desired plasma process and primarily consists of partial pressure contributions from the process gas, which may comprise one or more individual gas species, supplied to the evacuated process chamber 40.

A gas inlet plate 106 is fastened to an upper horizontal surface of the upper electrode 22. The gas inlet plate 106 is coupled by a gas port 112 and a delivery line 113 with a process gas supply 114. A mass flow controller and a flow measurement device (not shown) may be provided that cooperate to regulate the flow of each process gas from the process gas supply 114 to the gas port 112. The gas inlet plate 106 includes distribution passages (not shown) and the upper electrode 22 includes passages (not shown) coupled with the distribution passages of the gas inlet plate 106. The passages in the upper electrode 22 communicate with the process chamber 40 for injecting process gas into the process chamber.

The plasma processing system 10 includes a microprocessor-based controller (not shown) that is programmed to control the operation of, among other components, the power supply 30, the vacuum pump 36, and the process gas supply 114. For example, the controller regulates the power levels, voltages, currents and frequencies of the power supply 30 and orchestrates the provision of process gas from process gas supply 114 and the pumping rate of vacuum pump 36 to define a suitable pressure in process chamber 40 in accordance with the particular plasma process and application.

During processing of workpiece 55, the power applied between the upper and lower electrodes 22, 24 by power supply 30 produces an electromagnetic field in the process chamber 40 defined between the upper and lower electrodes 22, 24 when the lid 14 and base 16 are contacting and an environment suitable for plasma processing is provided. The electromagnetic field excites the process gas present in the processing region to a plasma state, which is sustained by the application of power from power supply 30 for the duration of the plasma treatment.

A forced flow of an appropriate cooling fluid may be circulated through the air gaps between the upper and lower electrodes 22, 24 and the enclosure 12, such as air gap 56, for cooling the plasma processing system 10 and, in particular, for cooling the upper and lower electrodes 22, 24. To that end, a fitting 57 (FIG. 2) may be provided in the lid 14 to define a coolant port for coupling a coolant supply 59 (FIG. 2) with these air gaps.

The upper and lower electrodes 22, 24 are formed from an electrically-conductive material, such as aluminum. The separating ring 26 is formed from a non-conducting dielectric material and is constructed to be able to withstand the plasma environment inside the process chamber 40 without unduly contaminating the processed workpiece 55. Generally, this implies that the material forming the separating ring 26 should be substantially resistant to etching by the plasma present in the process chamber 40. The separating ring 26 defines a vertical sidewall of non-conductive material, in addition to providing the vacuum seal between the upper and lower electrodes 22, 24.

Constituent species from the plasma contact and interact with exposed material on the workpiece 55 to perform the desired surface modification. The plasma is configured to perform the desired surface modification of the workpiece 55 by selecting parameters such, as the chemistry of the process gas, the pressure inside the process chamber 40, and the amount of power and/or frequency applied to the upper and lower electrodes 22, 24. The plasma processing system 10 may include an end point recognition system (not shown) that automatically recognizes when a plasma process (e.g., an etching process) has reached a predetermined end point or, alternatively, plasma processes may be timed based upon an empirically-determined process time.

With reference to FIGS. 3, 3A, 4, and 5 in which like reference numerals refer to like features in FIGS. 1 and 2, the workpiece vertical lift mechanism 200 generally includes a lift plate 202, a workpiece fixture 290, a set of resiliently-biased supports 240 mechanically coupling the workpiece fixture 290 with the lower electrode 24, and a set of resiliently-biased push devices 258 projecting from the upper electrode 22 toward the lower electrode 24 and the workpiece fixture 290. An outer peripheral edge or perimeter 274 of the workpiece fixture 290, winch is positioned between the upper and lower electrodes 22, 24, is encircled by the separating ring 26. After lid 14 is placed in the lowered position contacting the base 16 to seal the process chamber 40 from the ambient environment and the process chamber 40 is evacuated, the workpiece vertical lift mechanism 200 resides within the evacuated process chamber 40.

The workpiece fixture 290 includes a lift plate 202 and a workpiece ring 204 that are joined, for example, by a pin-in-socket type engagement in which one of the lift plate 202 or workpiece ring 204 carries a set of projecting pins (not shown) and the other of the lift plate 202 or workpiece ring 204 carries a set of sockets (not shown) that register and mate with the pins. The workpiece fixture 290 is automatically moveable in conjunction with opening and closing the lid 14 and without operator intervention between a raised position, when the lid 14 is opened, as best shown in FIG. 4, and a lowered position when the lid 14 is in a closed position relative to the base 16, as best shown in FIG. 5. In other words, the workpiece fixture 290 moves toward the lowered position as the upper electrode 22 is moved by the lid 14 toward the lower electrode 24 to seal the process chamber 40 and moves toward the raised position as the upper electrode 22 is moved by the lid 14 away from the lower electrode 24.

As best shown in FIGS. 3 and 3A, a cover plate 206 includes a cap 208 and a support 210 that underlies the cap 208. The cap 208 may also be joked with the support 210 by a pin-in-socket type engagement or, alternatively, the cap 208 and support 210 may constitute an integral, one-piece component. The cover plate 206 has a good electrical contact with the lower electrode 24, as does the workpiece ring 204 and lift plate 202, when the lid 14 is lowered. As a result, the workpiece fixture 290 and the workpiece 55 are at approximately the same electrical potential as the lower electrode 24 when the plasma processing system 10 is operating to generate a plasma inside the process chamber 40 and to process workpieces 55 inside the process chamber 40 with the plasma.

A recess 212 is located near each of the corners of the lower electrode 24. Each recess 212 has a base 211 that represents a relatively thin wall of the material of lower electrode 24 remaining after the respective recess 212 is formed or machined in the lower electrode 24. Projecting from the base 211 of each of the recesses 212 is a mounting post 214 with an internally threaded opening 216. Each mounting post 214 may be positioned to be substantially coaxial with the respective one of the recesses 212. In the assembly forming the support 240, a threaded tip 218 of a guide pin 220 is mated with the internally threaded opening 216 of each mounting post 214. The internally threaded opening 216 of each mounting post 214 is oriented such that the respective guide pin 220 projects in a direction toward the lift plate 202.

Each of the recesses 212 is also bounded peripherally by a substantially cylindrical sidewall 222 extending to the base 211 and a beveled or flared rim 224 disposed between sidewall 222 and a top surface 226 of the lower electrode 24. The diameter of the flared rim 224, which intersects the top surface 226, is greater than the diameter of the sidewall 222 of each recess 212.

Each guide pin 220 includes a substantially cylindrical, non-threaded shank 228 extending from the threaded tip 218 toward ahead 230. The head 230 may include a recessed feature 232 that receives the tip of a tool (not shown) used to generate the mated engagement between the threaded tip 218 of guide pin 220 and the internally-threaded opening 216. The head 230 of each guide pin 220, which projects at least partially above the nearby top surface 226 of the lower electrode 24, carries a flared surface 225 located near the non-threaded shank 228. The non-threaded shank 228 of each guide pin 220 and the sidewall 222 of the respective recess 212 have a substantially coaxial arrangement.

Each of the supports 240 includes a stop block 242 coupled by a respective one of the guide pins 220 with the lift plate 202 of the workpiece fixture 290. Each stop block 242 includes a body 244 with an enlarged head 246 and a central bore or passageway 248 extending the length of the body 244. The radially outward projection of enlarged head 246 relative to the body 244 defines an edge or lip 250, which extends circumferentially about the body 244. The enlarged head 246 of each stop block 242 further includes a first beveled or tapered exterior sidewall 252 that decreases in diameter with increasing distance from the lip 250 and a second beveled or tapered exterior sidewall 234 that increases in diameter with increasing distance from the lip 250. The exterior sidewall 234 is disposed between the lip 250 and the tapered exterior sidewall 252. The passageway 248 includes a substantially cylindrical surface 236 and a beveled or tapered surface 238 that narrows a portion of the substantially cylindrical surface 236.

A flared recess 254 is defined near each of the peripheral corners of the lift plate 202. The tapered exterior sidewall 252 of each stop block 242 is engaged with a respective one of the flared recesses 254. The depth of each flared recess 254 is selected such that a respective inclined surface 256 of the flared recess 254 and tapered exterior sidewall 252 of each stop block 242 are contacting when the lift plate 202 is secured with the stop blocks 242. The inclination angles of each flared recess 254 and the corresponding tapered exterior sidewall 252 of its stop block 242 are matched to assist in securing the stop blocks 242 with the lift plate 202, yet permit ready removability of the lift plate 202 by a vertical force of sufficient magnitude.

When mounted to the lift plate 202, the tapered surface 238 of passageway 248 in stop block 242 is located generally between one of the recesses 212 in the lower electrode 24 and the workpiece fixture 290. Disposed in each of the recesses 212 is a spring element 260, which may have the form of a compression spring formed from a helical coil of wire. Each spring element 260 is confined within the respective recess 212 and is captured between the base 211 and the lip 250 on the respective stop block 242.

Figure 6:
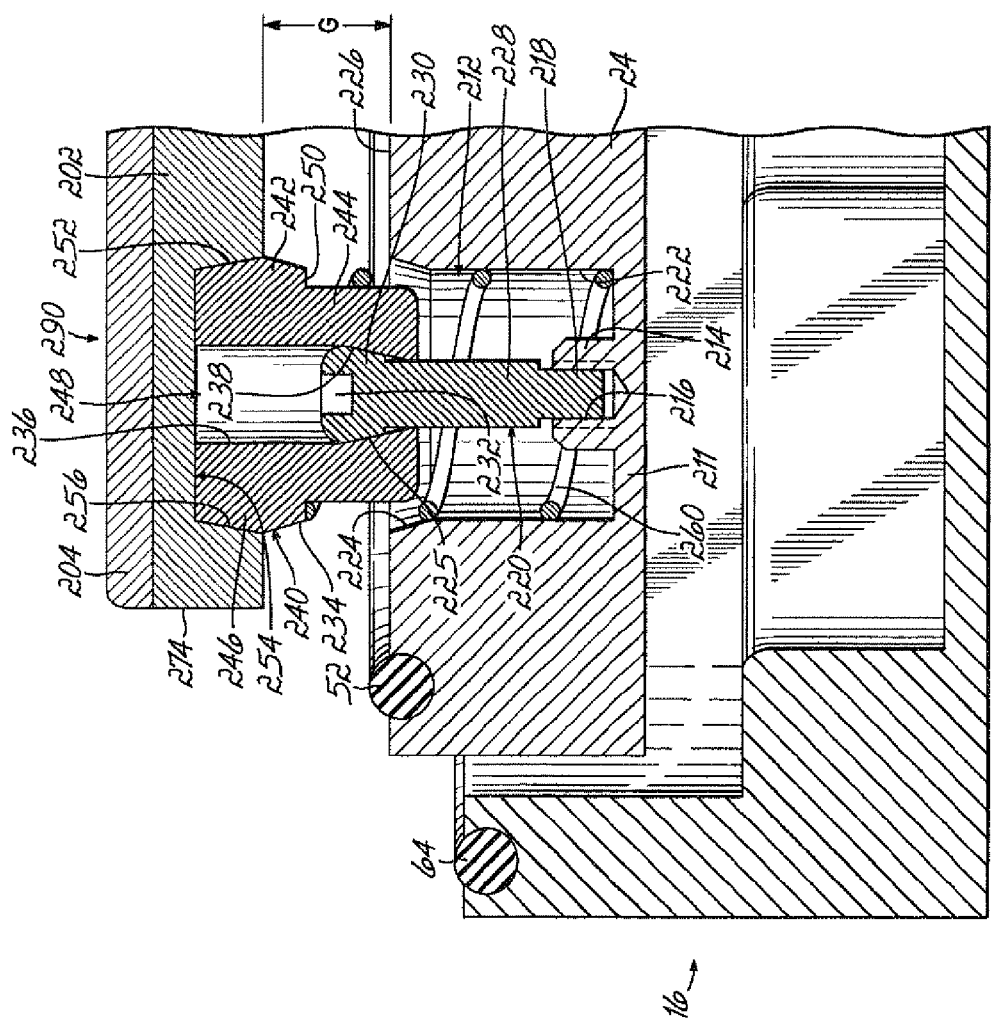
FIG. 6 is an enlarged view of a portion of FIG. 4.

As best shown in FIG. 6, the spring elements 260 are extended when the workpiece fixture 290 is in the raised position. As a result, the lift plate 202 and workpiece ring 204 of the workpiece fixture 290 are supported in a resiliently floating manner atop the supports 240. Under the load supplied by the lift plate 202 and workpiece ring 204, the spring elements 260 collectively have a spring force sufficient to suspend or elevate the lift plate 202 above the top surface 226 of lower electrode 24.

The tapered surface 238 contacts the flared surface 225 on the head 230 of guide pin 220 to provide a positive stop for vertical motion when the workpiece fixture 290 is in the raised position. The inclination angles of the flared surface 225 and the tapered surface 238 are matched so that each stop block 242 is self-centered on the respective guide pin 220 when the workpiece fixture 290 is in the raised position. This permits the workpiece fixture 290 to return to a reproducible spatial location when residing in the raised position. In turn, this provides a reproducible location within plasma processing system 10 for the workpiece 55 carried by the workpiece fixture 290.

As explained in detail below, movement of the lid 14 to a lowered position (FIG. 5) moves the workpiece fixture 290 toward a lowered position and, thereby, compresses the spring elements 260. As the workpiece fixture 290 is lowered, the head 230 of each of the guide pins 220 moves in its respective passageway 248 toward the lift plate 202.

As best shown in FIGS. 3 and 3A, the workpiece fixture 290 includes a central opening 270 extending entirely through the lift plate 202 and workpiece ring 204, and a gap 272 that extends radially from the central opening 270 to the outer perimeter 274 of the workpiece fixture 290. The cover plate 206 is dimensioned with a width substantially identical to the width of the gap 272. When the workpiece fixture 290 is lowered to a process position, the cover plate 206 fills the gap 272 so that the central opening 270 is surrounded by a substantially planar surface defined collectively by the top surface 266 of the workpiece ring 204 and a top surface 276 of the cover plate 206. To promote the requisite coplanar arrangement, the respective thicknesses of the cover plate 206 and workpiece fixture 290 are selected to be approximately equal, which permits the top surfaces 266, 276 to be approximately flush when the workpiece fixture 290 is in its lowered position. The central opening 270 is round in the representative embodiment. However, the central opening 270 may have other shapes; such as rectangular.

A shoulder or rim 278, winch is defined in the workpiece ring 204, coaxially encircles the central opening 270. The radial dimension or width of the rim 278 is selected such that only a thin annular surface area on the workpiece 55 is contacted by the rim 278. For example, the radial dimension of the rim 278 may be approximately equal to 3 mm. The diameter of the central opening 270 is approximately equal to the diameter of the workpiece 55 less the radial dimension of the rim 278. If the workpieces 55 are not round, the geometrical shape of the central opening 270 is selected to conform to the shape of the workpiece 55. The rim 278 is recessed below the top surface 266 of the workpiece ring 204 by an amount related to the thickness of the workpiece 55. When workpiece 55 is resting on, and supported by, rim 278, a top surface of the workpiece 55 is approximately coplanar with the top surface 266 of the workpiece ring 204.

The width of the gap 272 is selected such that an end effector 280 (FIG. 7) can pass through the gap 272 and access the central opening 270 for transferring unprocessed workpieces 55 to the workpiece fixture 290 and removing processed workpieces 55 from the workpiece fixture 290. The end effector 280 is coupled with a robot, such as a selective compliant articulated/assembly robot arm (SCARA) robot, as understood by a person having ordinary skill in the art.

The lower electrode 24 further comprises a removable electrode section 284, which includes a mounting flange 285 situated in a recess defined in the lower electrode 24 and the pedestal portion 286. The pedestal portion 286, which defines representative a workpiece support, projects from the mounting flange 285 toward the upper electrode 22. The electrode section 284 is secured with conventional fasteners to the underlying and surrounding remainder of the lower electrode 24. The top surface 226 of lower electrode 24 and the top surface 226 of the mounting flange 285 are approximately flush. The surface area of a top surface 288 of the pedestal portion 286, which is elevated above the surrounding mounting flange 285, is approximately equal to the open cross-sectional area radially inside the central opening 270. The diameter of the pedestal portion 286 is approximately equal to the diameter of the central opening 270 of workpiece ring 204. The electrode section 284 has a good electrical contact with the remainder of the lower electrode 24 so that the pedestal portion 286 and support 210 are at substantially the same potential as the lower electrode 24 when the plasma processing system 10 is operating and a plasma is present in the process chamber 40.

The cover plate 206 comprises another raised region of the electrode section 284 that projects above the plane of the mounting flange 285. The cover plate 206 and pedestal portion 286 may comprise a single or unitary raised region projecting from the mounting flange 285. Alternatively, the cover plate 206 may comprise a separate component that is mounted to the electrode section 284 and, in this instance, may include locating pins (not shown) or the like used to automatically position the cover plate 206 relative to the central opening 270 in the workpiece fixture 290.

When the workpiece fixture 290 is lowered to a process position, contact between the workpiece 55 and the top surface 288 of pedestal portion 286 transfers the workpiece 55 from the workpiece ring 204 to the pedestal portion 286. The transfer of the workpiece 55 is accomplished without any structure on the pedestal portion 286, the lower electrode 24, or the base 16 of the enclosure 12 guiding of the workpiece 55 onto the pedestal portion 286. In the lowered process position of the workpiece fixture 290, the top surface 266 of workpiece ring 204 is recessed slightly below the top surface 288 of the pedestal portion 286. During plasma treatment, the workpiece 55 rests on the top surface 288 of the pedestal portion 286.

The electrode section 284 and the lift plate 202 are constructed from an electrical conductor, such as aluminum. The cap 208 on the cover plate 206 and the workpiece ring 204 are constructed from an electrical insulator or dielectric, such as alumina or high-purity alumina. Alternatively, the cap 208 on the cover plate 206 and the workpiece ring 204 may also be constructed from an electrical conductor, such as aluminum. The selection of a constituent material for the cap 208 of the cover plate 206 and the workpiece ring 204 is dictated by the type of plasma performance required in the plasma processing system 10 for a particular plasma process on workpiece 55. Although not wishing to be bound by theory, it is believed that constructing the cap 208 of the cover plate 206 and workpiece ring 204 from an electrical conductor optimizes etch rate driven plasma processes or treatments and that constructing the cap 208 of the cover plate 206 and workpiece ring 204 from a dielectric optimizes uniformity driven plasma processes.

With reference to FIGS. 3A and 4, one of the push devices 258 is located spatially near each inside corner 15 of separating ring 26 and, as apparent, near each corresponding outside corner (not shown) of the upper electrode 22. Each of the push devices 258 includes a pusher block 262, which is secured with the upper electrode 22 by the cooperation between an insert 261 and a shoulder bolt 263, and a spring element 264. Each of the pusher blocks 262 has a substantially overlying relationship with a respective one of the stop blocks 242. One end of the spring element 264, which may have the form of a compression spring formed from a helical coil of wire, is captured between an enlarged head 265 of the pusher block 262 and the upper electrode 22. The pusher block 262 is constructed from an insulating or dielectric material, such as a ceramic, and the insert 261 and shoulder bolt 263 may be formed from a metal, such as a stainless steel. The shoulder bolt 263 has a threaded tip that is fastened in a threaded bolthole in the upper electrode 22. The pusher block 262 of each push device 258 is movable relative to the shoulder bolt 263 between a first position (FIG. 4) in which the spring element 264 is extended and a second position (FIG. 5) in which the spring element 264 is compressed. The spring element 264 supplies a preloaded bias to each pusher block 262 in the first position.

As the lid 14 is moved toward the base 16, the pusher block 262 of each of the push devices 258 contacts the top surface 266 of workpiece ring 204 and the spring elements 264 begin to compress. As the lid 14 approaches the base 16, the spring elements 264 are further compressed, which applies an increasing force to the workpiece ring 204 that causes the workpiece fixture 290 to move toward the top surface 288 of the pedestal portion 286 and toward the lower electrode 24. When the workpiece fixture 290 is in the lowered position, the tapered exterior sidewall 234 on each stop block 242 contacts the flared rim 224 of recess 212 and each pusher block 262 is moved to its second position.

The inclination angles of the flared rim 224 and tapered exterior sidewall 234 are approximately equal or matched. When the workpiece fixture 290 is in the lowered position, each of the flared rims 224 is in contact with the respective one of the exterior sidewalls 234. The contact automatically self-centers each stop block 242 within its respective recess 212. Consequently, each time that the lid 14 is lowered, the workpiece fixture 290 returns to a reproducible spatial location relative to the lower electrode 24 and removable electrode section 284 when the lid 14 moves the workpiece fixture 290 to the lowered position. In turn, this provides a reproducible location for successive workpieces 55 on the pedestal portion 286 during each sequential plasma treatments.

In use and with reference to FIGS. 1, 2, 3, 3A, and 4-11, the lid 14 is lifted to an open position relative to the base 16 (FIGS. 2, 7) and placed out of contact with the base 16. With the lid 14 lifted, the components of the workpiece vertical lift mechanism 200 have an initial arrangement as best shown in FIG. 4. The spring-biased supports 240 urge the workpiece fixture 290 away from the lower electrode 24 to provide the raised position. When the workpiece fixture 290 is in the raised position and contact is established between the tapered surface 225 and flared surface 238 of each spring-biased support 240, a reproducible location is defined for the central opening 270 so that the end effector 280 can reproducibly place workpieces 55 on the workpiece fixture 290.

Figure 7:
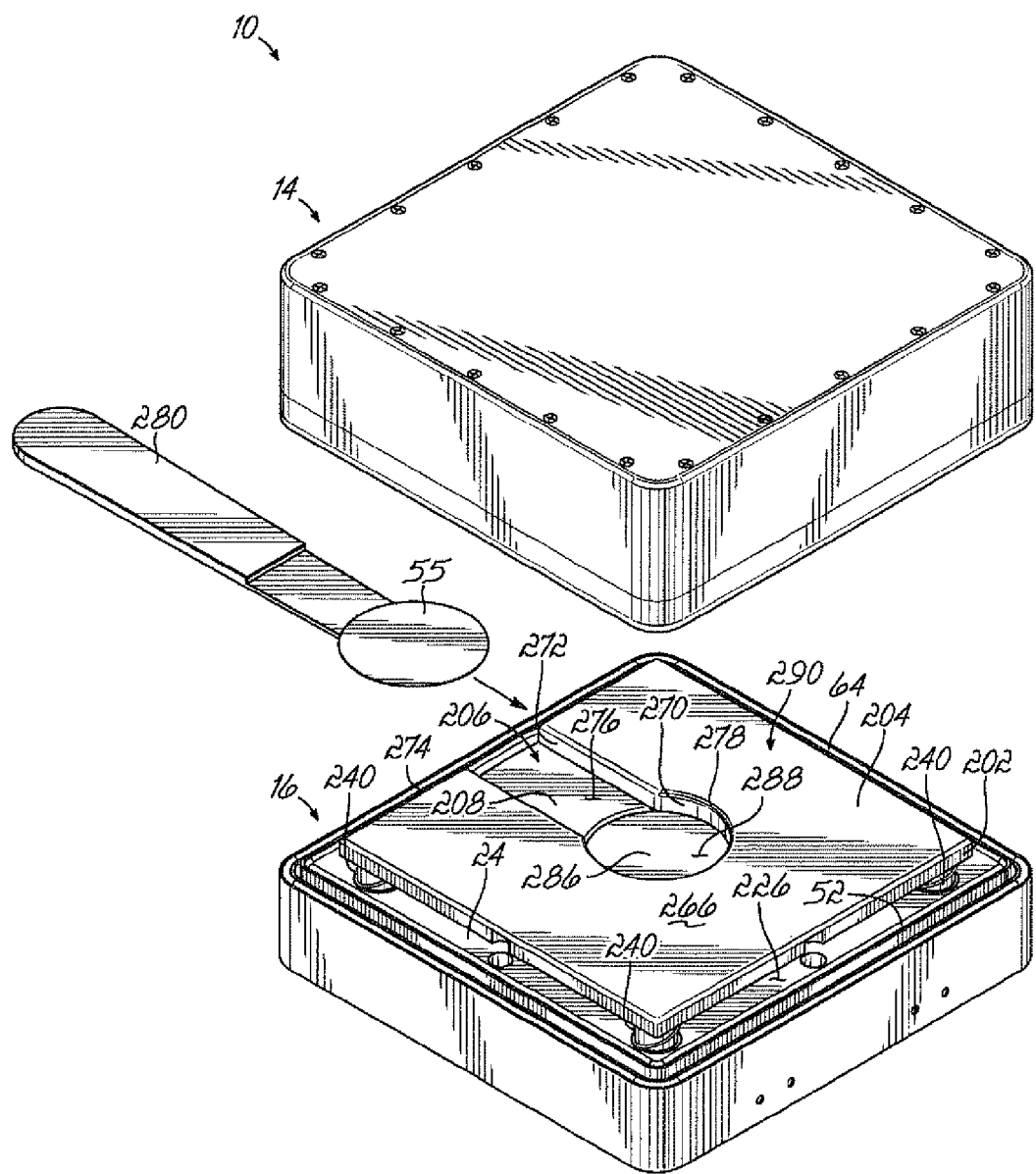
FIGS. 7-11 are perspective views similar to FIG. 1 illustrating the workpiece loading process.
Figure 8:
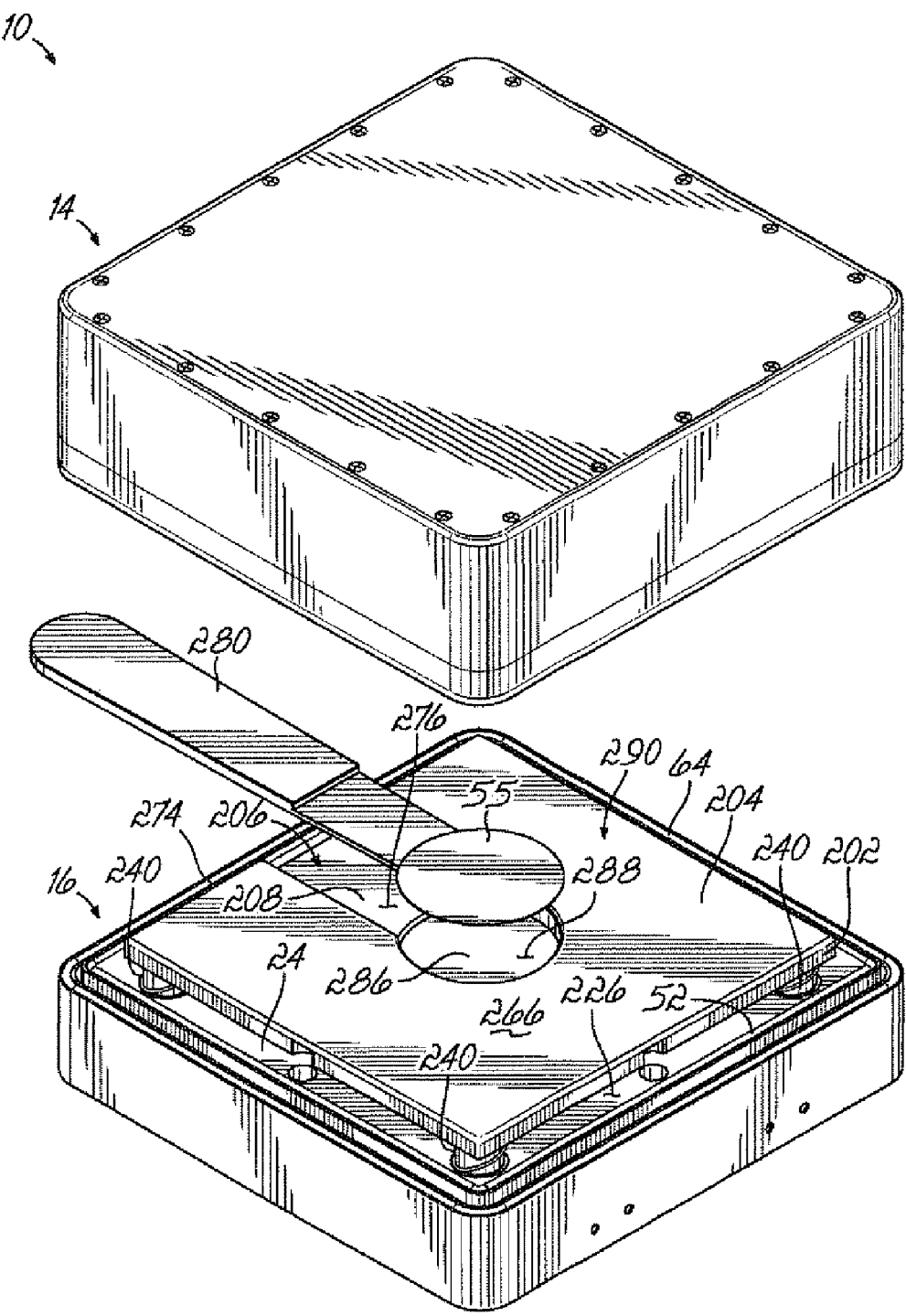

The end effector 280 is manipulated to transport one of the workpieces 55 to a location near to the plasma processing system 10, as shown in FIG. 7. The end effector 280 moves the workpiece 55 from this location, which is outside of the enclosure 12, to a position between the upper and lower electrodes 22, 24 and above the central opening 270, as shown in FIG. 8. When the workpiece 55 is transferred by the end effector 280 from the location outside of the enclosure into the position above the central opening 270 of the workpiece fixture 290, the workpiece 55 is not guided by any structure associated with the enclosure 12, such as rails or another type of mechanical constraint, associated with the base 16 of enclosure 12.

Figure 9:
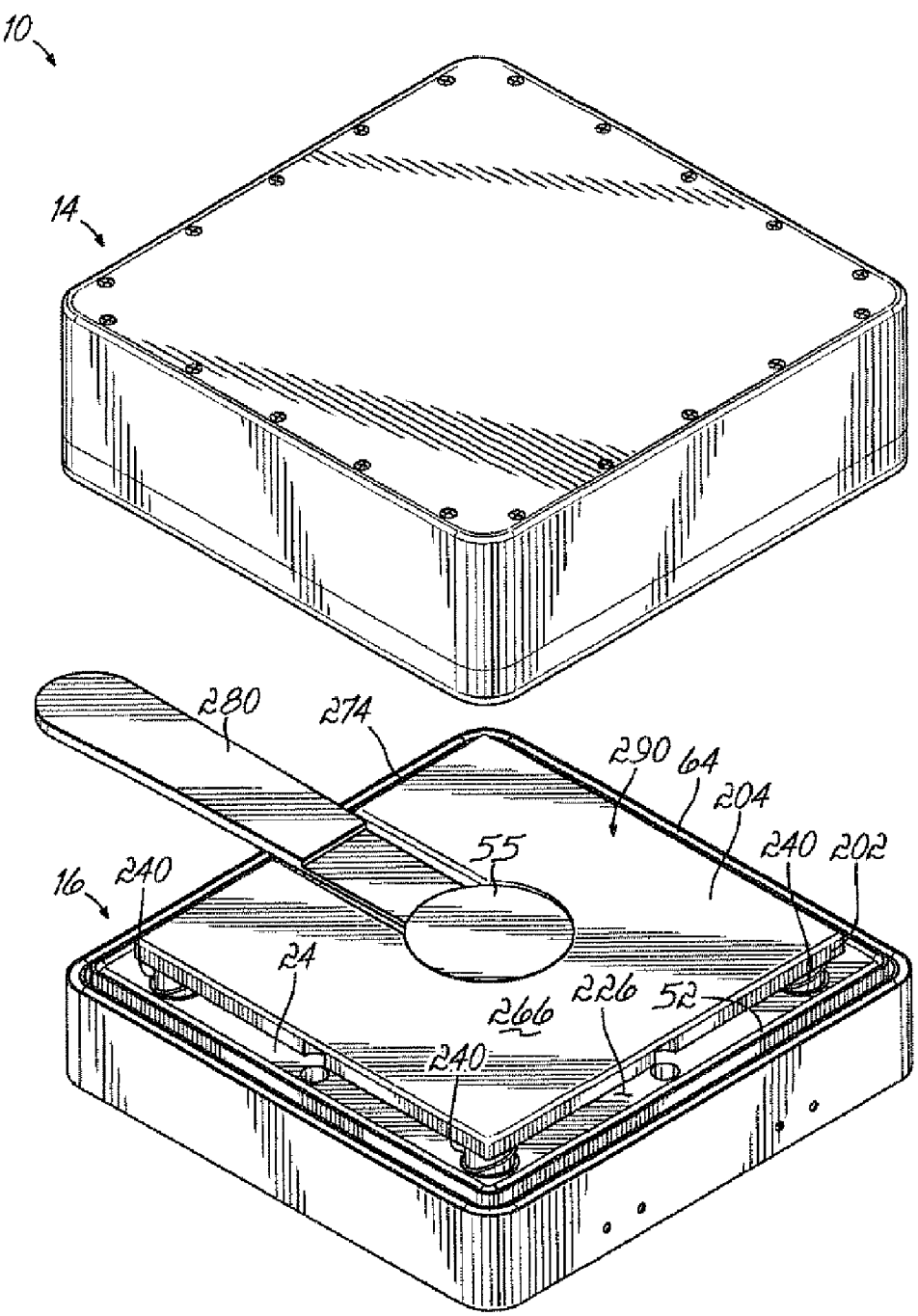
Figure 10:
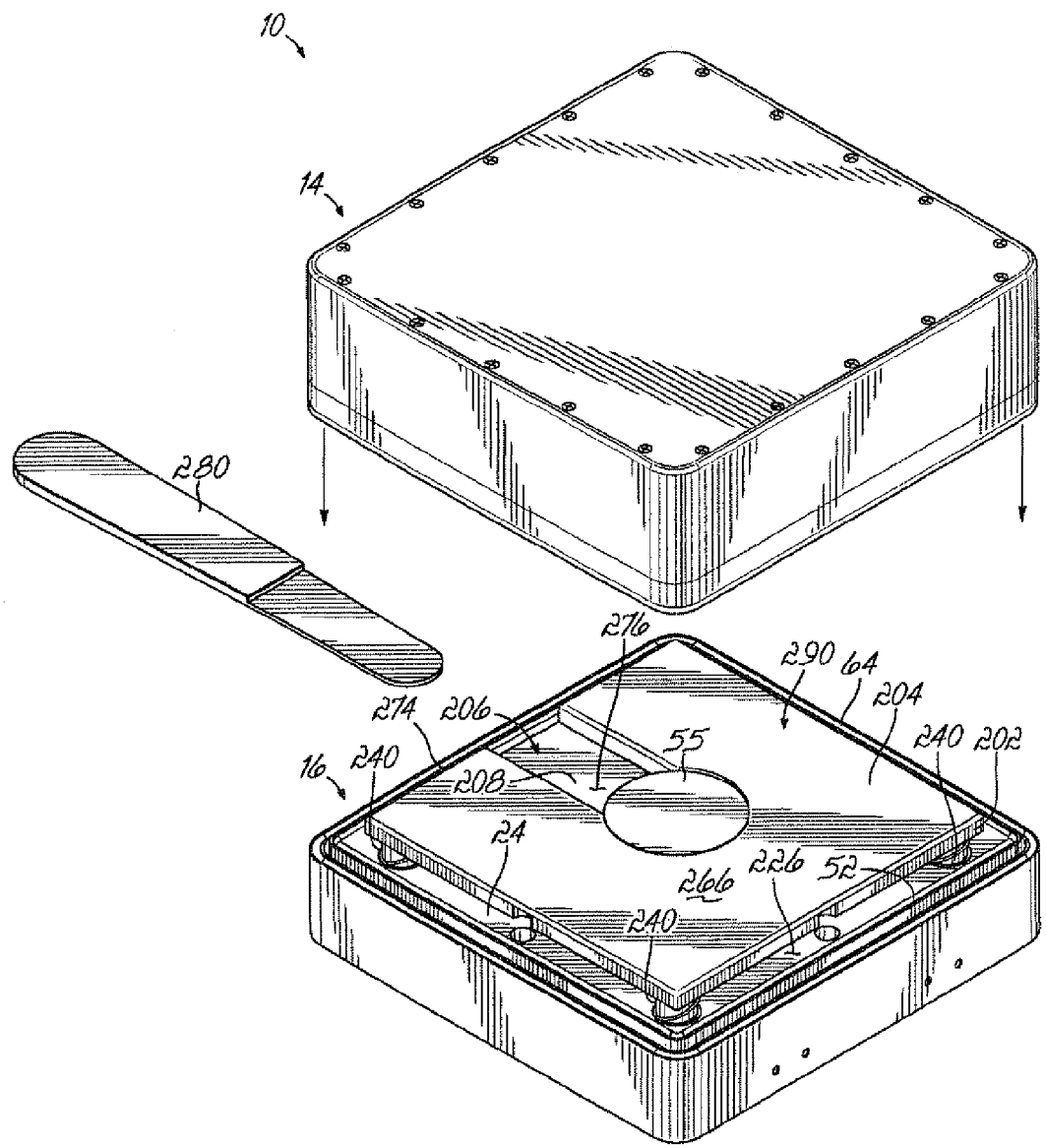

The end effector 280 is lowered so that the outer periphery of the workpiece 55 contacts the rim 278 inside the central opening 270 of workpiece ring 204, as shown in FIG. 9. The workpiece 55 is then fully supported on the rim 278. After the workpiece 55 is transferred to the workpiece fixture 290, the end effector 280 is withdrawn through the gap 272 to a location completely outside of the footprint of the lid 14 and base 16, as shown in FIG. 10. The end effector 280 physically fits within the gap 272 during this sequence of motions. The outer periphery of the workpiece 55 is supported by contact with the rim 278 of central opening 270 and is suspended above the lower electrode 24.

The lid 14 is lowered relative to the base 16, as shown in FIG. 10, and eventually contacts the base 16 to establish the closed position, as shown in FIG. 11. Lowering the lid 14 moves the upper electrode 22 toward the lower electrode 24. As the lid 14 is lowered toward the closed position, the pusher blocks 262 projecting from the upper electrode 22 contact the top surface 266 of the workpiece ring 204. The contact causes the spring elements 264 to compress, which applies a bias force to the workpiece fixture 290. The applied bias force from the spring elements 264 of the push devices 258 overcomes the opposing spring bias of the supports 240 and moves the workpiece fixture 290 toward the lower electrode 24. The motion of the workpiece 55 on the workpiece fixture 290 is in a vertical direction relative to the base 16 of the enclosure 12 and toward the lower electrode 24, and fails to include any significant motion component in a horizontal direction relative to the base 16.

Each guide pin 220 has a non-contacting relationship with the respective stop block 242 as the workpiece fixture 290 moves between the raised and lowered positions. As the workpiece fixture 290 nears the fully lowered position and the spring-biased supports 240 yields toward the lower electrode 24, the workpiece 55 is transferred from the rim 278 of workpiece ring 204 to the pedestal portion 286 of the lower electrode 24. At the fully lowered position of the workpiece fixture 290, the workpiece 55 rests on the pedestal portion 286 of the lower electrode 24 and a small clearance (e.g., 2 or 3 mils) exists between the rim 278 of workpiece ring 204 and the workpiece 55.

The process chamber 40 is evacuated using vacuum pump 36 and process gas is introduced from the gas inlet plate 106 to establish a suitable pressure. The upper and lower electrodes 22, 24 are energized by power supply 30 to generate a plasma from the sub-atmospheric pressure of process gas in the process chamber 40. When the plasma treatment of workpiece 55 is completed, the process chamber 40 is vented and the lid 14 of enclosure 12 is raised. Movement of the upper electrode 22 away from the lower electrode 24 opens the process chamber and eventually removes the contact between push devices 258 and the top surface 266 of workpiece ring 204. As a result, the force urging the workpiece fixture 290 toward the lower electrode 24 is gradually removed. The spring elements 260 of the spring-biased supports 240 are released to expand to their uncompressed state, which automatically elevates and restores the workpiece fixture 290 to the raised position. The motion of the workpiece 55 on the workpiece fixture 290 is in a vertical direction relative to the base 16 of the enclosure 12 and toward the upper electrode 22, and does not include any motion component in a horizontal direction relative to the base 16. The workpiece 55 is transferred from the pedestal portion 286 of the lower electrode 24 back to the rim 278 of workpiece ring 204.

As the raised position is approached, the tapered surface 225 and flared surface 238 of each spring-biased support 240 reestablish contact to again define the reproducible location for the central opening 270. The separation between the lower electrode 24 and the central opening 270 of the workpiece fixture 290 provides an open space for the end effector 280 to gain access to the backside of each processed workpiece 55, lift the processed workpiece 55 from the central opening 270, and withdraw the processed workpiece 55 from the plasma processing system 10. The end effector 280 physically fits within the gap 272 during tins sequence of motions. When the workpiece 55 is retrieved by the end effector 280 from the position within the central opening 270, the workpiece 55 is not guided by any structure associated with the enclosure 12.

The workpiece vertical lift mechanism 200 maintains a parallel plate design of the plasma processing system 10 while the plasma treatment occurs. The workpiece vertical lift mechanism 200 presents a passive wafer chucking system that eliminates the need for active mechanical assistance, such as mechanically- or electrically-actuated lift pins. This simplifies the design of the plasma processing system 10 because the workpiece vertical lift mechanism 200 eliminates the need for mechanical feedthroughs, and the like, that are characteristic of active wafer chucking systems with a concomitant cost reduction. The design of workpiece vertical lift mechanism 200 readily permits modifications to handle workpieces 55 of different dimensions. The workpiece vertical lift mechanism 200 may be retrofitted to existing plasma processing systems. Device regions of the workpiece 55 are not contacted by lift pins or any other mechanical structure during workpiece exchanges. Instead, the workpiece fixture 290 permits the workpiece 55 to be lifted and lowered by contact only between rim 278 and a narrow annular band near the workpiece's peripheral edge.

In an alternative embodiment, the separating ring 26 may be omitted and the interior of the enclosure 12 may be otherwise configured to define a volume that is evacuated by the vacuum pump 36 to define a process chamber similar to process chamber 40. In this instance, the upper and lower electrodes 22, 24 are resident in the process chamber 40. In another alternative embodiment, the upper electrode 22 and the lid 14 may be consolidated into a unitary structure in which all or a portion of the lid 14 operates as an electrode.

The lift plate 202 and workpiece ring 204 of the workpiece fixture 290, the removable electrode section 284 and its pedestal 286, and the cover plate 206 may be collectively replaced as a component set to adapt the workpiece vertical lift mechanism 200 to handle workpieces 55 of different sizes and/or geometrical shapes.

Figure 12:
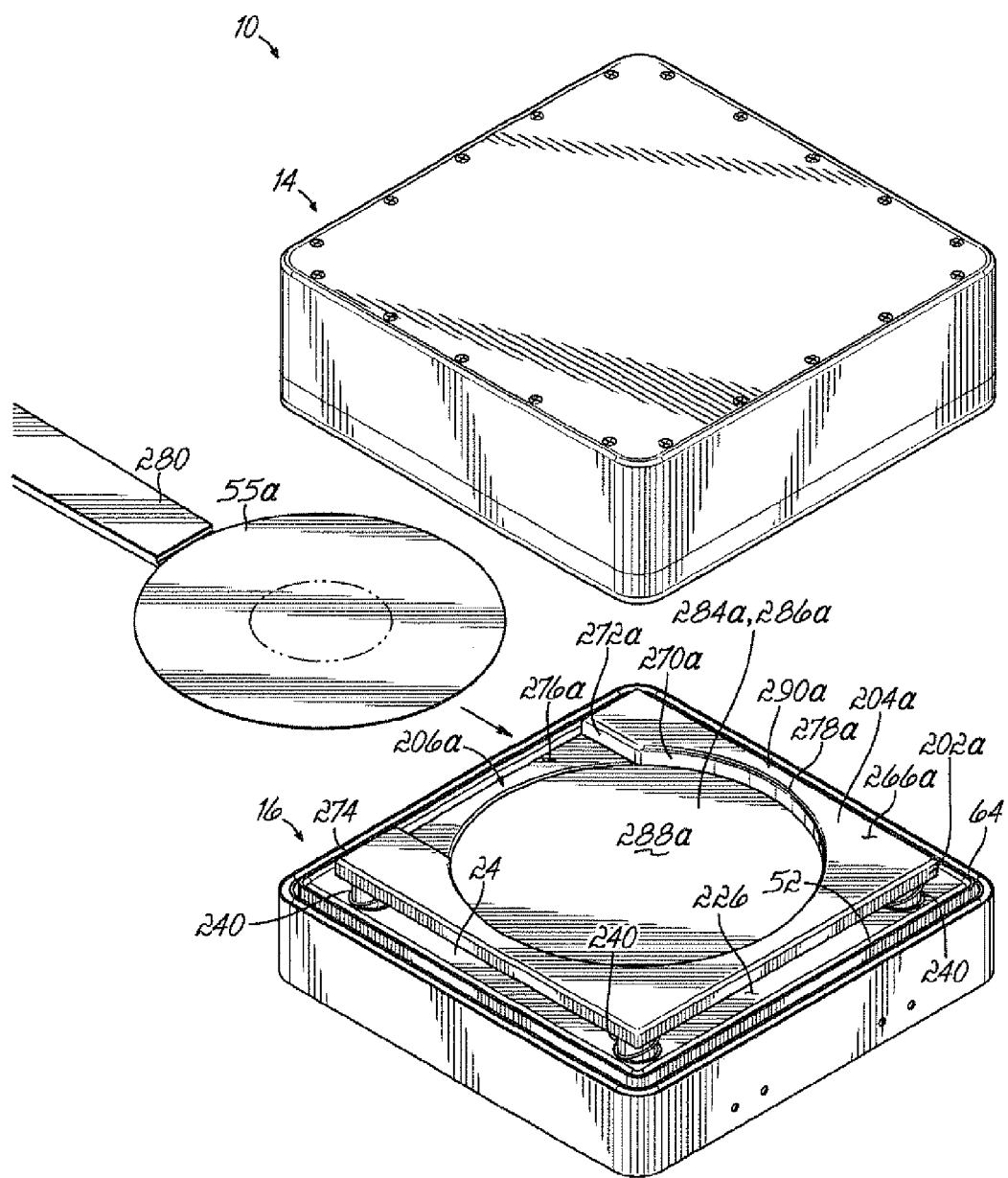
FIG. 12 is a perspective view showing a workpiece vertical lift mechanism in accordance with an alternative embodiment of the invention.

As shown in FIG. 12 in which like reference numerals refer to like features in FIGS. 1-11 and in accordance with an alternative embodiment, a workpiece fixture 290a includes a lift plate 202a and a workpiece ring 204a that are similar in construction to lift plate 202 and workpiece ring 204. The workpiece fixture 290a has a round central opening 270a and a rim 278a of a different diameter than the respective central opening 270 and rim 278 of workpiece fixture 290 (FIG. 3) for accommodating a workpiece 55a with the representative disk shape and characterized by a different diameter than workpiece 55. The replacement entails removing the assembly consisting of the lift plate 202 and workpiece ring 204 of workpiece fixture 290 from the lower electrode 24 with a lifting force of a magnitude effective to disengage the flared recesses 254 from the corresponding tapered exterior sidewall 252 of the respective stop blocks 242. The replacement workpiece fixture 290a is installed by engaging the flared recesses (not shown) in the lift plate 202a, which are similar to the flared recesses 254 in lift plate 202, with the same supports 240. The guide pins 220 and stop blocks 242 are capable of being universally used with each of the workpiece fixtures 290, 290a. All that is required is to establish a physical connection between the supports 240 and the specific one of the workpiece fixtures 290, 290a installed in the plasma processing system 10.

A new removable electrode section 284a is installed, as a replacement for electrode section 284, that includes a pedestal portion 286a dimensioned diametrically to fit within the central opening 270a. In the representative embodiment, the outer diameter of pedestal portion 286a is slightly less than the inner diameter of the round central opening 270a. A cover plate 206a, which is similar to cover plate 206, is disposed in a gap 272a, which is similar to gap 272 but slightly wider due to the larger dimensions of the central opening. The pusher blocks 262, which remain the same, move the workpiece fixture 290a between the raised and lowered positions in conjunction with the opening and closing of the lid 14. When the workpiece fixture 290a is in the lowered position, a top surface 266a of workpiece fixture 290a and a top surface 276a of cover plate 206a are approximately coplanar and the pedestal portion 286a projects slightly above the top surfaces 276a and 288a. As a result, the workpiece 55a contacts and is supported by a top surface 288a of the pedestal portion 286a.

Additional workpiece fixtures, cover plates, and electrode sections (not shown) may be supplied that are substantially identical to workpiece fixtures 290, 290a, cover plates 206, 206a, and electrode sections 284, 284a, but in which these components cooperate to accommodate round, disk-shaped workpieces of different diameters. For example, a set of four different component sets may be provided for use with the plasma processing system 10 to support 100 mm, 150 mm, 200 mm and 300 mm wafers, respectively, by simply replacing the workpiece fixture, cover plate, and electrode section.

Figure 13:
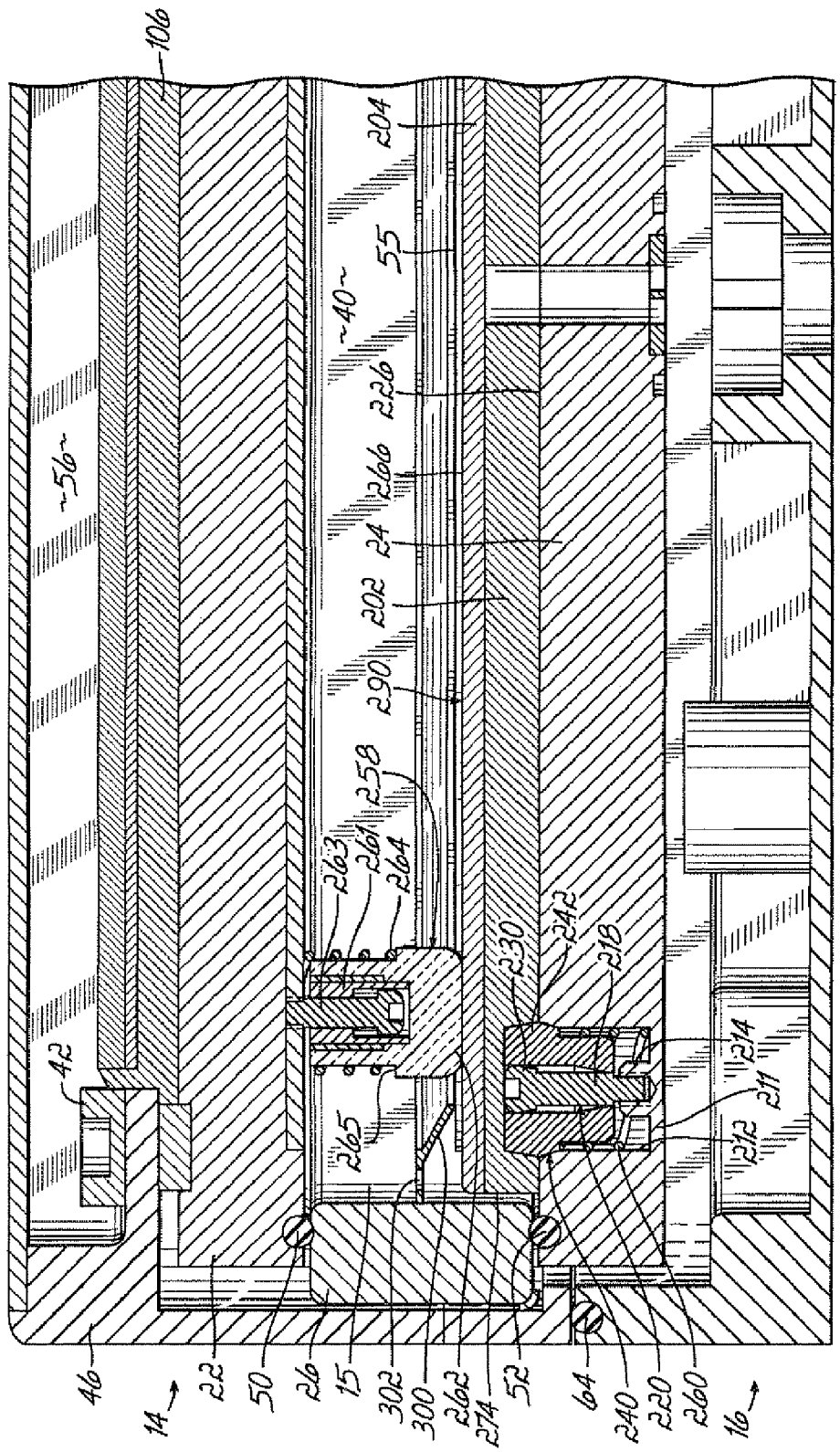
FIG. 13 is a perspective view of a workpiece vertical lift mechanism in accordance with an alternative embodiment of the invention.

With reference to FIG. 13 in which like reference numerals refer to like features in FIGS. 1-12 and in an alternative embodiment, a compression ring 300 may be carried by the lid 14 that, when the lid 14 is closed, contacts the workpiece 55 to establish a seal encircling the outer perimeter of the workpiece 55 and press the workpiece 55 downward toward the pedestal portion 286. The compression ring 300 includes perforations 302 for the passage of gases that permit the process chamber 40 to be evacuated by vacuum pump 36.

References herein to terms such as "vertical", "horizontal", etc. are made by way of example, and not by way of limitation, to establish a three-dimensional frame of reference. Terms, such, as "upper", "lower", "on", "above", "below", "side" (as in "sidewall"), "higher", "lower", "over", "beneath" and "under", are defined with respect to the horizontal plane. It is understood that various other frames of reference may be employed without departing from the spirit and scope of the invention as a person of ordinary skill will appreciate that the defined frame of reference is relative as opposed to absolute.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept. The scope of the invention itself should only be defined by the appended claims.

What is claimed is:

1. An apparatus for processing a workpiece, the apparatus comprising:
   a process chamber including an upper electrode and a lower electrode, said lower electrode including a pedestal portion having a top surface configured to support the workpiece during processing; and
   a workpiece vertical lift mechanism in said process chamber, said workpiece vertical lift mechanism including a plate disposed between said upper electrode and said lower electrode, said plate including an outer perimeter and a first opening inside the outer perimeter that is dimensioned to receive said pedestal portion, and said plate configured to move vertically relative to said pedestal portion between a first position in which said opening in said plate holds the workpiece in a non-contacting relationship with said pedestal portion and a second position in which said pedestal portion projects above said plate so as to transfer support of the workpiece from said opening in said plate to the top surface of said pedestal portion.

2. The apparatus of claim 1 wherein said upper electrode is movable toward said lower electrode, and further comprising:
   a plurality of spring-biased pusher blocks mechanically coupled with said upper electrode, said spring-biased pusher blocks adapted to contact said plate, as said upper electrode is moved toward said lower electrode, so as to move said plate from the first position to the second position.

3. The apparatus of claim 2 further comprising:
   a base; and
   a lid movable relative to said base between an open position in which said lid is separated from said base and a closed position in which said lid is proximate to said base,
   wherein said upper electrode is mechanically coupled with said lid, and said spring-biased pusher blocks are adapted to contact said plate, as said lid is moved from the open position toward the closed position, so as to urge said plate from the first position toward the second position.

4. The apparatus of claim 1 wherein said upper and lower electrodes have approximately parallel confronting surfaces, and said plate is located between said confronting surfaces.

5. The apparatus of claim 1 further comprising:
   a dielectric separating ring between said lower electrode and said upper electrode, said dielectric separating ring, said lower electrode, and said upper electrode collectively bounding said process chamber, and said plate located peripherally inside said dielectric separating ring.

6. The apparatus of claim 1 wherein said upper electrode is movable toward said lower electrode, and further comprising:
   a plurality of spring-biased supports configured to couple said with said lower electrode, said spring-biased supports configured to urge said plate away from said lower electrode to provide the first position.

7. The apparatus of claim 6 further comprising:
   a base; and
   a lid movable relative to said base between an open position in which said lid is separated from said base and a closed position in which said lid is proximate to said base,
   wherein said upper electrode is mechanically coupled with said lid, and said spring-biased supports are adapted to yield as said upper electrode moves toward said lower electrode so as to permit said plate to move from the first position to the second position.

8. The apparatus of claim 6 wherein said first opening is configured to support the workpiece when said plate is in the first position, and further comprising:
   a second member configured to be coupled by said spring-biased supports with said lower electrode as a replacement for said plate, said second member including a second opening of a different diameter than said first opening in said plate.

9. The apparatus of claim 8 wherein said pedestal portion is dimensioned to fit within said first opening, and said pedestal portion is configured to be removed from said process chamber for exchange with another pedestal portion dimensioned to fit within said second opening in said second member.

10. The apparatus of claim 1 wherein said pedestal portion projects from said lower electrode toward said upper electrode.

11. The apparatus of claim 1 wherein said plate includes a gap extending from said opening to said outer perimeter.

12. The apparatus of claim 11 further comprising:
    a stationary member supported by said lower electrode, said stationary member having a fixed position relative to said pedestal portion as said upper electrode moves relative to said lower electrode, and said stationary member at least partially filling said gap when said plate is in the second position.

13. The apparatus of claim 12 wherein said plate has a first surface and said stationary member has a second surface, said first and second surfaces are oriented to face toward said upper electrode, and said first and second surfaces are substantially coplanar when said plate is in the second position.

14. The apparatus of claim 13 further comprising:
    a layer of a dielectric material on a majority of a surface area on each of said first and second surfaces.

15. The apparatus of claim 1 further comprising:
    a flexible perforated ring that encircles a perimeter of the workpiece when the workpiece is disposed on said pedestal portion.

* * * * *

UNITED STATES PATENT AND TRADEMARK OFFICE
CERTIFICATE OF CORRECTION

PATENT NO. : 8,245,663 B2  
APPLICATION NO. : 12/376175  
DATED : August 21, 2012  
INVENTOR(S) : James P. Fazio Page 1 of 1

It is certified that error appears in the above-identified patent and that said Letters Patent is hereby corrected as shown below:

In the Specification:

At column 2, line number 26, after "with", delete ",".

At column 3, line number 65, change "tire" to --The--.

At column 5, line number 48, change "winch" to --which--.

At column 6, line number 7, change "joked" to --joined--.

At column 8, line number 5, change "winch" to --which-- and at line number 33, change "representative a" to --a representative--.

At column 10, line number 66, change "yeilds" to --yield--.

At column 11, line number 39, change "tins" to --this--.

At column 13, line number 15, change "applicants" to --applicant--.

In the Claims:

At column 14, claim number 6, line number 14, after the first occurrence of "said" insert --plate--.

Signed and Sealed this  
Thirteenth Day of November, 2012

David J. Kappos  
*Director of the United States Patent and Trademark Office*